United States Patent
Hayashi et al.

(10) Patent No.: US 7,960,227 B2
(45) Date of Patent: Jun. 14, 2011

(54) MANUFACTURING METHOD OF SEMICONDUCTOR DEVICE

(75) Inventors: Yasuhiro Hayashi, Kawasaki (JP); Kazutoshi Izumi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/543,179

(22) Filed: Aug. 18, 2009

(65) Prior Publication Data

US 2010/0261294 A1    Oct. 14, 2010

Related U.S. Application Data

(62) Division of application No. 11/495,769, filed on Jul. 31, 2006, now abandoned.

(30) Foreign Application Priority Data

Mar. 28, 2006  (JP) ................................. 2006-089312

(51) Int. Cl.
    *H01L 21/8242* (2006.01)
(52) U.S. Cl. ............ 438/253; 438/3; 438/396; 257/303; 257/306
(58) Field of Classification Search .................. 438/253, 438/396, 3; 257/303, 306, E21.008, E21.575
    See application file for complete search history.

(56) References Cited

U.S. PATENT DOCUMENTS

| | | | |
|---|---|---|---|
| 6,207,465 B1 | 3/2001 | Cuchiaro et al. | |
| 6,475,860 B2 | 11/2002 | Kwon et al. | |
| 6,485,988 B2 | 11/2002 | Ma et al. | |
| 6,700,153 B2* | 3/2004 | Oh et al. | 257/309 |
| 2003/0089954 A1* | 5/2003 | Sashida | 257/369 |
| 2006/0178282 A1 | 8/2006 | Suyama et al. | |

FOREIGN PATENT DOCUMENTS

| | | |
|---|---|---|
| JP | 11-307731 A | 11/1999 |
| JP | 2002-151659 | 5/2002 |
| JP | 2003-174095 | 6/2003 |
| JP | 2004-235560 A | 8/2004 |
| JP | 2004-277576 A | 10/2004 |
| JP | 2006-253532 A | 9/2006 |

OTHER PUBLICATIONS

Japanese Office Action, Partial English-language translation, mailed Nov. 9, 2010 for corresponding Japanese Application No. 2006-089312.
USPTO, [DOAN] "U.S. Appl. No. 11/495,769 (parent)",[CTRS] Requirement for Restriction/Election issued on Feb. 25, 2008.
USPTO, [DOAN] "U.S. Appl. No. 11/495,769 (parent)",[CTNF] Non-Final Rejection issued on Aug. 6, 2008.
USPTO, [DOAN] "U.S. Appl. 11/495,769 (parent)",[CTFR] Final Rejection issued on Mar. 18, 2009.

* cited by examiner

*Primary Examiner* — Theresa T Doan
(74) *Attorney, Agent, or Firm* — Fujitsu Patent Center (57) ABSTRACT

After a first via hole leading to a ferroelectric capacitor structure are formed in an interlayer insulating film by dry etching, a second via hole to expose part of the ferroelectric capacitor structure is formed in a hydrogen diffusion preventing film so as to be aligned with the first via hole by wet etching, and a via hole constructed by the first via hole and the second via hole communicating with each other is formed.

10 Claims, 7 Drawing Sheets

FIG. 7A
CHEMICAL TREATMENT

FIG. 7B
WASHING TREATMENT

FIG. 7C
DRYING TREATMENT

MANUFACTURING METHOD OF SEMICONDUCTOR DEVICE

CROSS-REFERENCE TO RELATED APPLICATIONS

This application is a divisional application of U.S. application Ser. No. 11/495,769, filed Jul. 31, 2006, and titled "Semiconductor Device and Manufacturing Method of the Same." Each of these applications is based upon, and claims the benefit of priority from, prior Japanese Patent Application No. 2006-089312, filed on Mar. 28, 2006, the entire contents of which is incorporated herein by reference.

BACKGROUND OF THE INVENTION

1. Field of the Invention

The present invention relates to a semiconductor device including a ferroelectric capacitor structure formed by sandwiching a ferroelectric film between a lower electrode and an upper electrode.

2. Description of the Related Art

In recent years, the development of a ferroelectric memory (FeRAM) which holds information in a ferroelectric capacitor structure using polarization inversion of a ferroelectric has been advanced. The ferroelectric memory is a nonvolatile memory in which held information is not erased even if the power is turned off, and attracts special attention because it is expected to be able to realize high-density integration, high-speed driving, high durability, and low power consumption.

Mainly used as a material for a ferroelectric film constituting the ferroelectric capacitor structure is a ferroelectric oxide having a perovskite crystal structure such as a $PZT(Pb(Zr,Ti)O_3))$ film, a $SBT(SrBi_2Ta_2O_9)$ film, or the like with a large remanent polarization amount, for example, from about 10 ($\mu C/cm^2$) to about 30 ($\mu C/cm^2$).

It is known that in the ferroelectric capacitor structure, the characteristic of a capacitor film made of the ferroelectric deteriorates due to water which has penetrated from the outside through an interlayer insulating film such as a silicon oxide film having a high affinity to water. Namely, first, the water which has penetrated from the outside is decomposed into hydrogen and oxygen during a high-temperature process when the interlayer insulating film and a metal wiring are formed. When penetrating into the capacitor film, this hydrogen reacts with oxygen in the capacitor film to thereby form oxygen deficiency in the capacitor film, which results in a reduction in crystallinity. The same phenomenon occurs also by prolonged use of the ferroelectric capacitor. As a result, deterioration in the performance of the ferroelectric capacitor structure such as a reduction in the remanent polarization amount and dielectric constant of the capacitor film occurs. Further, the performance of not only the ferroelectric capacitor structure but also a transistor or the like sometimes deteriorates due to such penetration of hydrogen.

As a way of dealing with this problem peculiar to the FeRAM, it is proposed that a hydrogen diffusion preventing film made of alumina or the like is formed so as to cover the ferroelectric capacitor structure. This hydrogen diffusion preventing film makes it possible to prevent hydrogen from penetrating into the capacitor film and hold the high capacitor characteristic of the FeRAM.

(Patent Document 1)
Japanese Patent Application Laid-open No. 2003-174095
(Patent Document 2)
Japanese Patent Application Laid-open No. 2002-26287
(Patent Document 3)
Japanese Patent Application Laid-open No. 2002-151659

Incidentally, when an opening (via hole) for wiring connection is formed for the ferroelectric capacitor in a state where the interlayer insulating film is formed so as to cover the ferroelectric capacitor of the FeRAM with the hydrogen diffusion preventing film therebetween, the interlayer insulating film and the hydrogen diffusion preventing film are dry etched so that the position of the surface of the ferroelectric capacitor is exposed (See Patent Documents 1 to 3). However, in this case, plasma at the time of dry etching sometimes causes damage to the ferroelectric capacitor. There is a problem that to recover this damage, it is indispensable, for example, to perform annealing in an $O_2$ atmosphere, so that an increase in the number of steps is inevitable.

Further, due to dry etching, unwanted residuals such as an etching residue and a scum occur in the opening and on the interlayer insulating film, and the residuals contribute to a reduction in the reliability of the ferroelectric capacitor.

SUMMARY OF THE INVENTION

The present invention is made in view of the above-described problems, and its object is to provide a highly reliable semiconductor device which makes it possible to form an opening for a ferroelectric capacitor in an interlayer insulating film and a hydrogen diffusion preventing film and moreover remove unwanted residuals without unnecessarily increasing the number of steps and causing damage to the ferroelectric capacitor and a manufacturing method of the same.

A manufacturing method of a semiconductor device of the present invention comprises the steps of: forming a capacitor structure, which is constructed by sandwiching a capacitor film made of a ferroelectric between a lower electrode and an upper electrode, above a semiconductor substrate; forming a hydrogen diffusion preventing film so that the capacitor structure is covered therewith; forming an interlayer insulating film which covers the capacitor structure with the hydrogen diffusion preventing film therebetween; and forming an opening in the interlayer insulating film and the hydrogen diffusion preventing film so that at least part of the capacitor structure is exposed in order to perform wiring connection of the capacitor structure, and in the step of forming the opening, by performing: a first step of forming a first opening in the interlayer insulating film by dry etching; and a second step of forming a second opening in a portion of the hydrogen diffusion preventing film aligned with the first opening by wet etching, the opening constructed by the first opening and the second opening communicating with each other is formed.

A semiconductor device of the present invention comprises: a capacitor structure which is constructed by sandwiching a capacitor film made of a ferroelectric between a lower electrode and an upper electrode and formed above a semiconductor substrate; a hydrogen diffusion preventing film which is formed so as to cover the capacitor structure; an interlayer insulating film which covers the capacitor structure with the hydrogen diffusion preventing film therebetween; and a conductive material which fills an opening formed in the interlayer insulating film and the hydrogen diffusion preventing film so that at least part of the capacitor structure is exposed, and the opening is constructed by a first opening formed in the interlayer insulating film by dry etching and a second opening formed in a portion of the hydrogen diffusion preventing film aligned with the first opening by wet etching communicating with each other.

DETAILED DESCRIPTION OF THE PREFERRED EMBODIMENTS

Basic Gist of the Present Invention

As a result of assiduous study to form an opening for a ferroelectric capacitor in an interlayer insulating film and a hydrogen diffusion preventing film without causing damage due to plasma of dry etching to the ferroelectric capacitor, the present inventor has found that this damage is particularly due to dry etching of the hydrogen diffusion preventing film and has reached the present invention. In the present invention, an opening (first opening) of an interlayer insulating film (and some other film) covering a ferroelectric capacitor with a hydrogen diffusion preventing film therebetween is formed by dry etching as is conventionally done, and an opening (second opening) of the hydrogen diffusion preventing film is formed by wet etching so as to be aligned with the first opening.

In this case, when the first opening is formed by dry etching, the hydrogen diffusion preventing film exists at the bottom of the opening, and, so to speak, the ferroelectric capacitor is protected from plasma of dry etching by this hydrogen diffusion preventing film. Therefore, the ferroelectric capacitor is not damaged at the time of this dry etching. Then, the remaining hydrogen diffusion preventing film is wet etched to form the second opening so that the second opening is aligned with the first opening. Here, the first opening is formed in an anisotropic shape which imitates the shape of a resist pattern, whereas the second opening is formed in an isotropic shape having a slightly lager diameter than the first opening, and both communicate with each other, thereby forming the opening.

In this wet etching, the second opening is formed in a self-aligned manner by the first opening without causing such damage as in dry etching to the ferroelectric capacitor. Besides, simultaneously with the formation of the second opening in the hydrogen diffusion preventing film, unwanted residuals such as an etching residue and a scum which occur in the first opening and on the interlayer insulating film due to dry etching at the time of the formation of the first opening are removed by an etching solution of the wet etching.

As described above, in the present invention, the hydrogen diffusion preventing film covering the ferroelectric capacitor is formed to prevent deterioration in capacitor characteristic, and the process of recovering the damage due to dry etching after the opening for the ferroelectric capacitor is formed becomes unnecessary. Moreover, this wet etching makes it possible to remove unwanted residuals which occur due to dry etching simultaneously with the formation of the second opening and perform the next step in a state where the surface of the interlayer insulating film and the interior of the opening are cleaned.

SPECIFIC EMBODIMENT TO WHICH THE PRESENT INVENTION IS APPLIED

A specific embodiment to which the present invention is applied will be described in detail below with reference to the drawings. In this embodiment, a case where the present invention is applied to a FeRAM including a ferroelectric capacitor structure which uses a ferroelectric film as a capacitor film will be shown as an example. In this embodiment, for convenience of description, a constitution of the FeRAM will be described with a manufacturing method thereof. Note that the present invention is also applicable to a semiconductor memory which uses a common dielectric film as the capacitor film.

In this embodiment, a so-called planar-type FeRAM having a constitution in which continuity is obtained by forming conductive plugs on a lower electrode and an upper electrode of the ferroelectric capacitor structure, respectively, is shown as an example.

FIG. 1A to FIG. 6 are schematic sectional views showing the constitution of the planar-type FeRAM according to this embodiment with the manufacturing method thereof step by step.

Figure 1A:
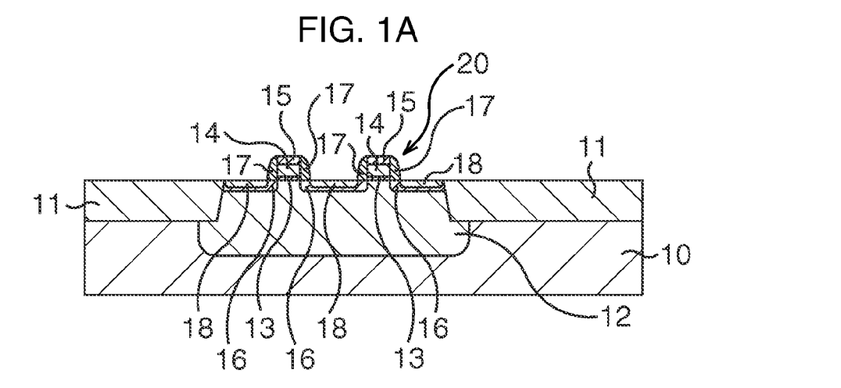
FIG. 1A to FIG. 1D are schematic sectional views showing a constitution of a planar-type FeRAM according to the present embodiment with a manufacturing method thereof step by step.

First, as shown in FIG. 1A, MOS transistors 20 which function as selection transistors are formed on a silicon semiconductor substrate 10.

To put it in detail, element isolation structures 11 are formed on a surface layer of the silicon semiconductor substrate 10, for example, by an STI (Shallow Trench Isolation) method to determine an element active region.

Then, an impurity, here B, is ion-implanted into the element active region, for example, under the condition of a dose amount of $3.0 \times 10^{13}/cm^2$ and an acceleration energy of 300 keV to form a well 12.

Subsequently, a thin gate insulating film 13 with a thickness of about 3.0 nm is formed in the element active region by thermal oxidation or the like, a polycrystalline silicon film with a thickness of about 180 nm and, for example, a silicon nitride film with a thickness of about 29 nm are deposited on the gate insulating film 13 by a CVD method, and the silicon nitride film, the polycrystalline silicon film, and the gate insulating film 13 are fabricated into electrode shapes by lithography and dry etching subsequent thereto, whereby gate electrodes 14 are pattern-formed on the gate insulating film 13. At this time, a cap film 15 made of a silicon nitride film is pattern-formed on each of the gate electrodes 14.

Thereafter, with the cap film 15 as a mask, an impurity, here arsenic (As), is ion-implanted into the element active region, for example, under the condition of a dose amount of $5.0\times 10^{14}/cm^2$ and an acceleration energy of 10 keV to form so-called LDD regions 16.

Then, by depositing, for example, a silicon oxide film over the entire surface by the CVD method and performing so-called etch back on the silicon oxide film, the silicon oxide film is left only on side surfaces of the gate electrodes 14 and the cap film 15 to form a sidewall insulating film 17.

Subsequently, with the cap film 15 and the sidewall insulating film 17 as a mask, an impurity, here phosphorus (P), is ion-implanted into the element active region under the condition where the impurity concentration becomes higher than that in the LDD regions 16 to form source/drain regions 18 superimposed on the LDD regions 16, and thus the MOS transistors 20 are completed.

Figure 1B:
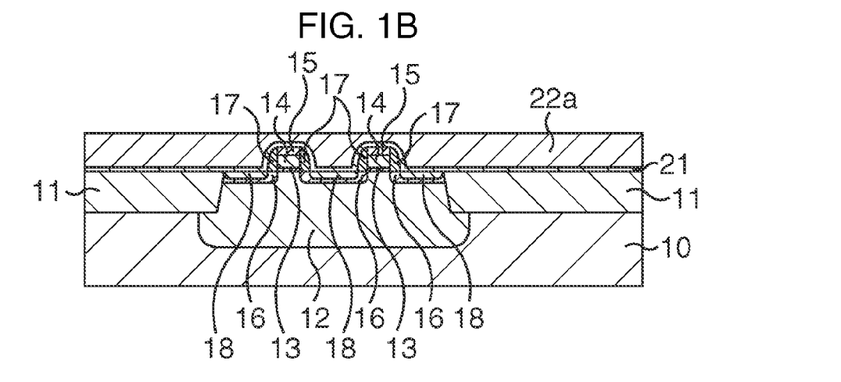

Thereafter, as shown in FIG. 1B, a protective film 21 of the MOS transistors 20 and an interlayer insulating film 22a are formed in sequence.

To be more precise, the protective film 21 and the interlayer insulating film 22a are deposited in sequence so as to cover the MOS transistors 20. Here, the protective film 21 is deposited with a thickness of about 20 nm by the CVD method using a silicon oxide film as its material. As the interlayer insulating film 22a, a stacked structure in which, for example, a plasma SiO film (with a thickness of about 20 nm), a plasma SiN film (with a thickness of about 80 nm), and a plasma TEOS film (with a thickness of about 1000 nm) are formed in sequence is formed, and after stacking, it is polished to a thickness of about 70 nm by CMP.

Figure 1C:
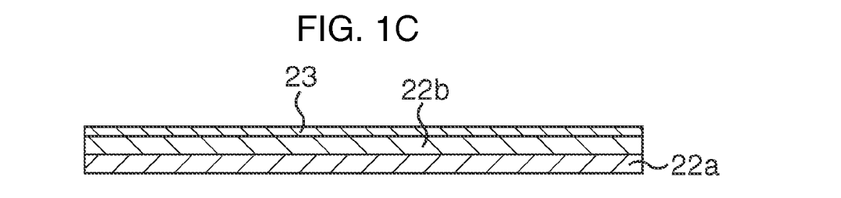

Then, as shown in FIG. 1C, an interlayer insulating film 22b and a hydrogen diffusion preventing film 23 are formed in sequence. Incidentally, in FIG. 1C and its following figures, for convenience of illustration, only the constitution of and above the interlayer insulating film 22a will be shown, and the silicon semiconductor substrate 10, the MOS transistors 20, and so on will not be shown.

To put it in detail, first, a silicon oxide film with a thickness of about 100 nm is deposited on the interlayer insulating film 22a, for example, by a plasma CVD method using TEOS to form the interlayer insulating film 22b. Thereafter, the interlayer insulating film 22b is annealed. As the condition of this annealing, the annealing is performed, for example, for 20 seconds to 45 seconds at 650° C. while $N_2$ gas is supplied at a flow rate of 20 lit/min.

Subsequently, the hydrogen diffusion preventing film 23 to prevent deterioration in the capacitor characteristic of a ferroelectric capacitor structure described later (to prevent hydrogen generated due to water generated from outside or an upper-layer insulating film from penetrating into the ferroelectric film) is formed on the interlayer insulating film 22b. The hydrogen diffusion preventing film 23 is deposited with a thickness from about 20 nm to about 50 nm by a sputtering method or the CVD method (MO-CVD method, for example), using at least one kind selected from the group consisting of $Al_2O_3$ (alumina), Al nitrogen oxide, Ta oxide, and Ti oxide, here alumina, as its material. By adopting the MO-CVD method, it becomes possible to form a denser alumina film, which can produce a high hydrogen diffusion preventing effect. Thereafter, the hydrogen diffusion preventing film 23 is annealed. As the condition of this annealing, the annealing is performed, for example, for 30 seconds to 120 seconds at 650° C. while $O_2$ gas is supplied at a flow rate of 2 lit/min.

Figure 1D:
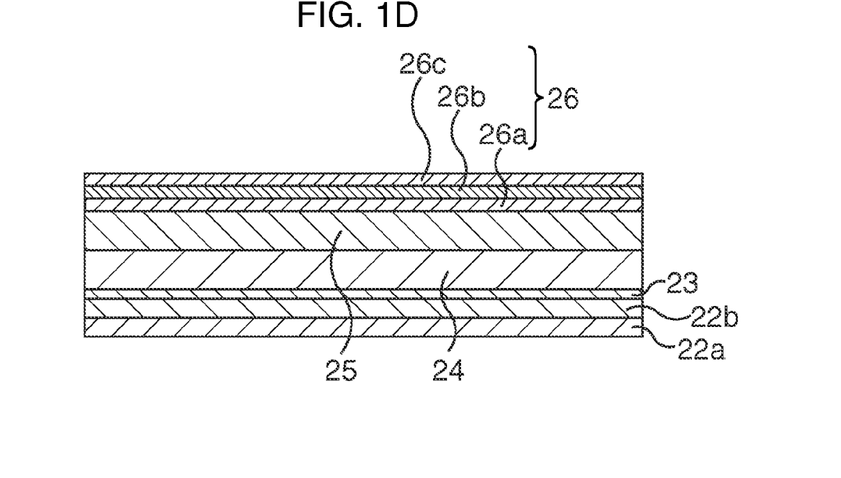

Then, as shown in FIG. 1D, a lower electrode layer 24, a ferroelectric film 25, and an upper electrode layer 26 are formed in sequence.

To be more precise, first, a Pt film is deposited, for example, with a thickness from about 150 nm to about 200 nm by the sputtering method to form the lower electrode layer 24.

Next, by an RF sputtering method, the ferroelectric film 25 made of a ferroelectric, for example, $PbZr_{1-x}Ti_xO_3$ (PZT: $0<x<1$) is deposited with a thickness from about 100 nm to about 300 nm on the lower electrode layer 24. Then, the ferroelectric film 25 is annealed, so that this ferroelectric film 25 is crystallized. As the condition of this annealing, the annealing is performed, for example, for 60 seconds to 120 seconds at 550° C. to 650° C. while $Ar/O_2$ gas is supplied at an Ar flow rate of 1.98 lit/min and an $O_2$ flow rate of 0.025 lit/min. As a material for the ferroelectric film 25, in place of PZT, $Pb_{1-x}La_xZr_{1-y}Ti_yO_3$ ($0<x<1$, $0<y<1$), $SrBi_2(Ta_xNb_{1-x})_2O_9$ ($0<x<1$), $Bi_4Ti_2O_{12}$, or the like may be used.

Subsequently, the upper electrode layer 26 is formed by deposition on the ferroelectric film 25.

As the upper electrode layer 26, first, by a reactive sputtering method, for example, an $IrO_2$ film 26a which is a conductive oxide is formed with a thickness from about 30 nm to about 70 nm. Thereafter, the $IrO_2$ film 26a film is annealed. As the condition of this annealing, the annealing is performed, for example, for 10 seconds to 60 seconds at 650° C. to 850° C. while $Ar/O_2$ gas is supplied at an Ar flow rate of 2.0 lit/min and an $O_2$ flow rate of 0.02 lit/min. Then, an $IrO_2$ film 26b is formed with a thickness from about 150 nm to about 300 nm on the $IrO_2$ film 26a by the reactive sputtering method. Subsequently, a noble metal film such as platinum (Pt), iridium (Ir), or the like, here a Pt film 26c, which functions as a cap film of the $IrO_2$ film 26b is formed with a thickness of about 100 nm on the $IrO_2$ film 26b by the sputtering method. The upper electrode layer 26 is composed of the $IrO_2$ films 26a and 26b and the Pt film 26c. Incidentally, in the upper electrode layer 26, in place of the $IrO_2$ films 26a and 26b, Ir, Ru, $RuO_2$, $SrRuO_3$, or any other conductive oxide, or a stacked structure thereof may be used. It is also possible to omit the formation of the Pt film 26c.

Figure 2A:
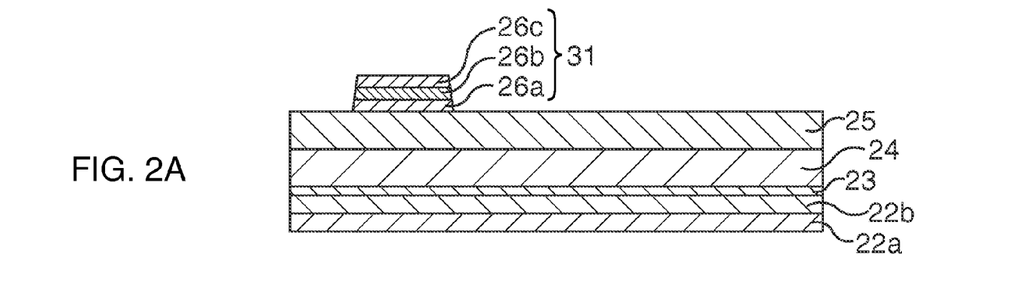
FIG. 2A to FIG. 2D are schematic sectional views showing the constitution of the planar-type FeRAM according to the present embodiment with the manufacturing method thereof step by step.

Thereafter, as shown in FIG. 2A, an upper electrode 31 is pattern-formed.

To put it in detail, the upper electrode layer 26 is fabricated into plural electrode shapes by lithography and dry etching subsequent thereto, thereby pattern-forming the upper electrode 31.

Figure 2B:
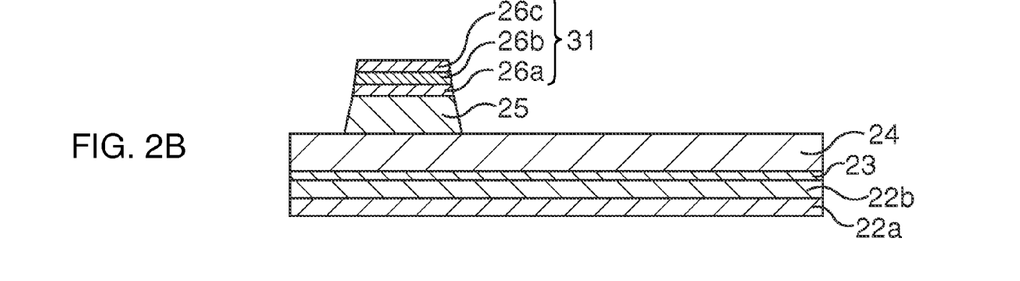

Then, as show in FIG. 2B, the ferroelectric film 25 is fabricated.

To be more precise, the ferroelectric film 25 is fabricated by lithography and dry etching subsequent thereto while being aligned with the upper electrode 31. After patterning the ferroelectric film 25, the ferroelectric film 25 is annealed so that the function of the ferroelectric film 25 can be recovered.

Figure 2C:
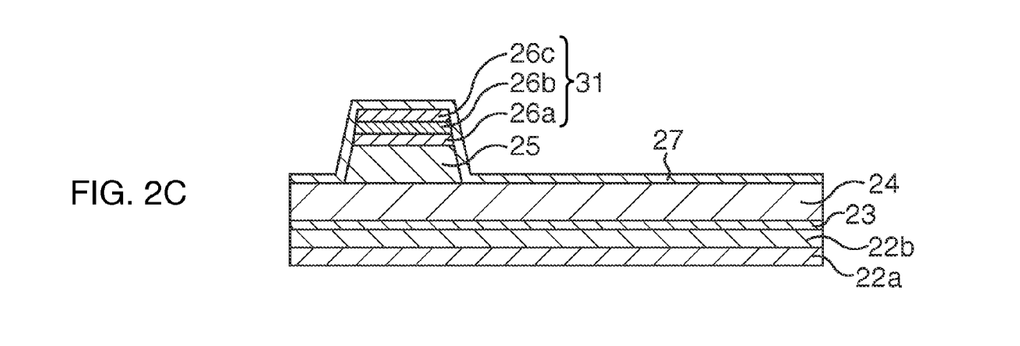

Subsequently, as shown in FIG. 2C, a hydrogen diffusion preventing film 27 to prevent hydrogen and water from penetrating into the ferroelectric film 25 is formed.

To put it in detail, using at least one kind selected from the group consisting of $Al_2O_3$ (alumina), Al nitrogen oxide, Ta oxide, and Ti oxide, here alumina, as its material, the hydrogen diffusion preventing film 27 is formed by being deposited with a thickness of about 50 nm on the lower electrode layer 24 by the sputtering method or the CVD method (MO-CVD method, for example) so as to cover the ferroelectric film 25 and the upper electrode 31. By adopting the MO-CVD method, it becomes possible to form a denser alumina film, which can produce a high hydrogen diffusion preventing effect. Thereafter, the hydrogen diffusion preventing film 27 is annealed.

Figure 2D:
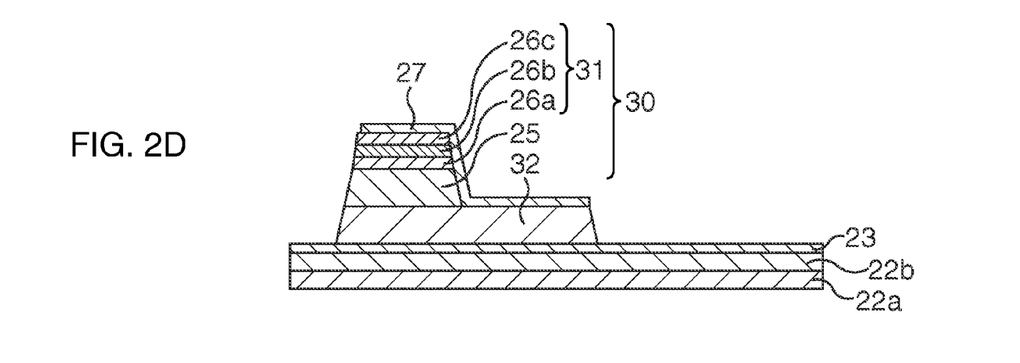

Then, as shown in FIG. 2D, the lower electrode layer 24, together with the hydrogen diffusion preventing film 27, is fabricated to complete a ferroelectric capacitor structure 30.

To be more precise, the hydrogen diffusion preventing film 27 and the lower electrode layer 24 are fabricated by lithography and dry etching subsequent thereto while being aligned with the fabricated ferroelectric film 25 so that the lower electrode layer 24 is left with a larger size than the ferroelectric film 25, thereby pattern-forming a lower electrode 32. Thus, the ferroelectric film 25 and the upper electrode 31 are sequentially stacked on the lower electrode 32, and the ferroelectric capacitor structure 30 in which the lower electrode 32 and the upper electrode 31 are capacitively coupled via the ferroelectric film 25 is completed. At this time, the hydrogen diffusion preventing film 27 is simultaneously left so as to cover an upper surface of the upper electrode 31, side surfaces of the upper electrode 31 and the ferroelectric film 25, and an upper surface of the lower electrode layer 24. Thereafter, the hydrogen diffusion preventing film 27 is annealed.

Figure 3A:
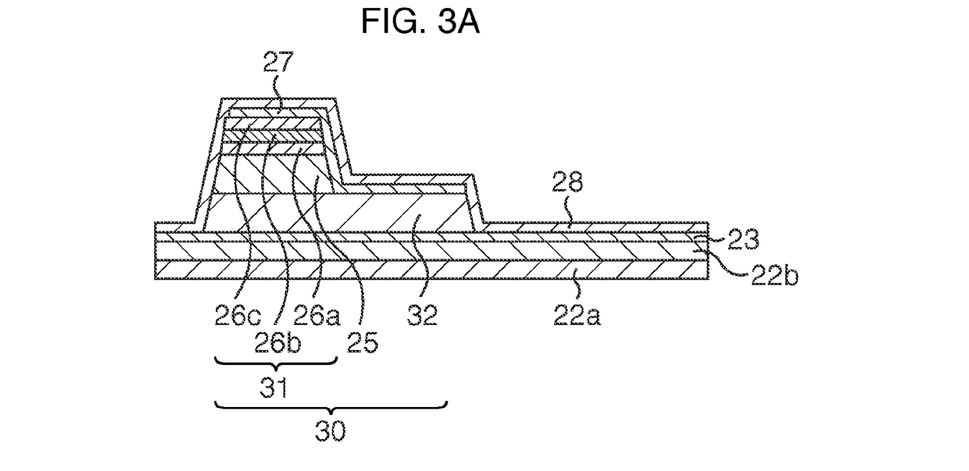
FIG. 3A to FIG. 3C are schematic sectional views showing the constitution of the planar-type FeRAM according to the present embodiment with the manufacturing method thereof step by step.

Then, as shown in FIG. 3A, a hydrogen diffusion preventing film 28 is formed.

To put it in detail, the hydrogen diffusion preventing film 28 to prevent deterioration in the capacitor characteristic of the ferroelectric capacitor structure 30 (to prevent hydrogen generated due to water generated from outside or an upper-layer insulating film from penetrating into the ferroelectric film 25) is formed so as to cover the entire surface of the ferroelectric capacitor structure 30. The hydrogen diffusion preventing film 28 is deposited with a thickness from about 20 nm to about 50 nm by the sputtering method or the CVD method (MO-CVD method, for example), using at least one kind selected from the group consisting of $Al_2O_3$ (alumina), Al nitrogen oxide, Ta oxide, and Ti oxide, here alumina, as its material. By adopting the MO-CVD method here, it becomes possible to form a denser alumina film, which can produce a high hydrogen diffusion preventing effect. Thereafter, the hydrogen diffusion preventing film 28 is annealed.

Figure 3B:
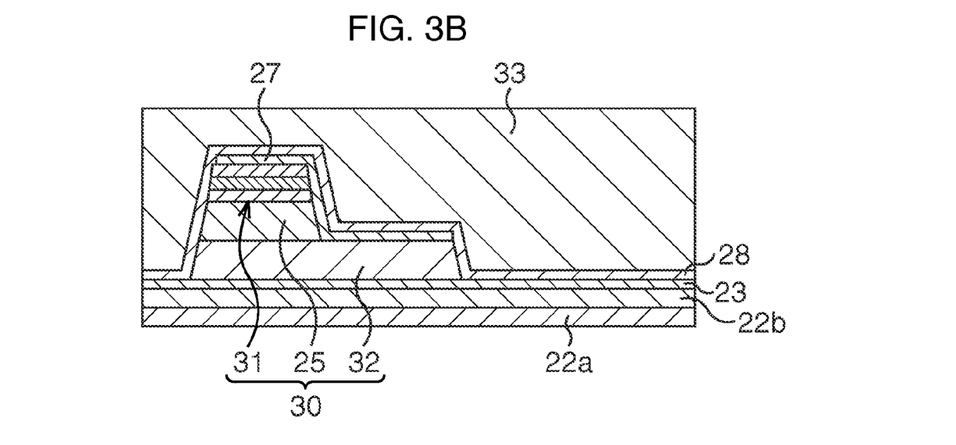

Then, as shown in FIG. 3B, an interlayer insulating film 33 is formed.

To be more precise, the interlayer insulating film 33 is formed so as to cover the ferroelectric capacitor structure 30 with the hydrogen diffusion preventing films 27 and 38 therebetween. Here, the interlayer insulating film 33 is formed by depositing a silicon oxide film with a thickness from about 1500 nm to about 2500 nm, for example, by the plasma CVD method using TEOS and thereafter polishing it to a thickness of about 1000 nm by CMP. After CMP, for example, $N_2O$ plasma annealing is performed for the purpose of dehydrating the interlayer insulating film 33.

Figure 3C:
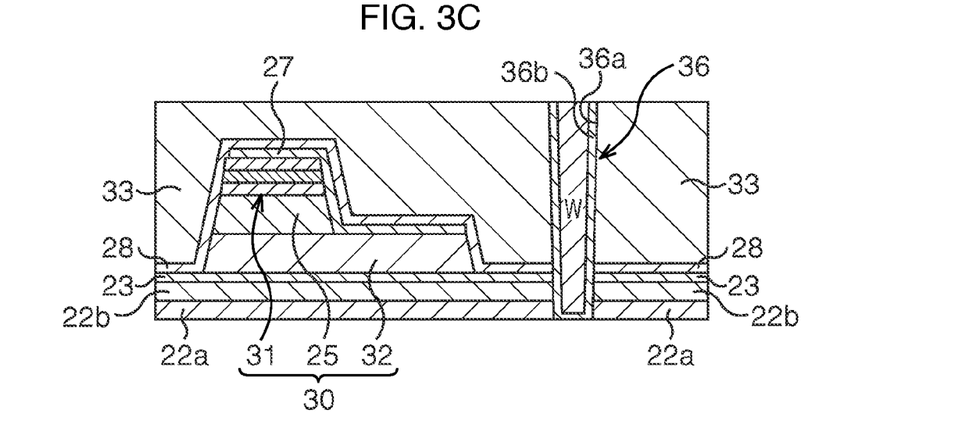

Then, as shown in FIG. 3C, a plug 36 connected the source/drain region 18 of the transistor structure 20 is formed.

To put it in detail, first, with the source/drain region 18 as an etching stopper, the interlayer insulating film 33, the hydrogen diffusion preventing films 28 and 27, the interlayer insulating films 22b and 22a, and the protective film 21 are fabricated by lithography and dry etching subsequent thereto until part of the surface of the source/drain region 18 is exposed, thereby forming a via hole 36a, for example, with a diameter of about 0.3 μm.

Subsequently, for example, a Ti film and a TiN film are deposited in sequence with a thickness of about 20 nm and a thickness of about 50 nm, respectively, by the sputtering method so as to cover a wall surface of the via hole 36a, thereby forming a base film (glue film) 36b. Thereafter, for example, a W film is formed so as to fill the via hole 36a with the glue film 36b therebetween by the CVD method. Then, the W film and the glue film 36b are polished with the interlayer insulating film 33 as a stopper by CMP, thereby forming the plug 36 constructed by filling the via hole 36a with W with the glue film 36b therebetween. After CMP, for example, $N_2O$ plasma annealing is performed.

Figure 4A:
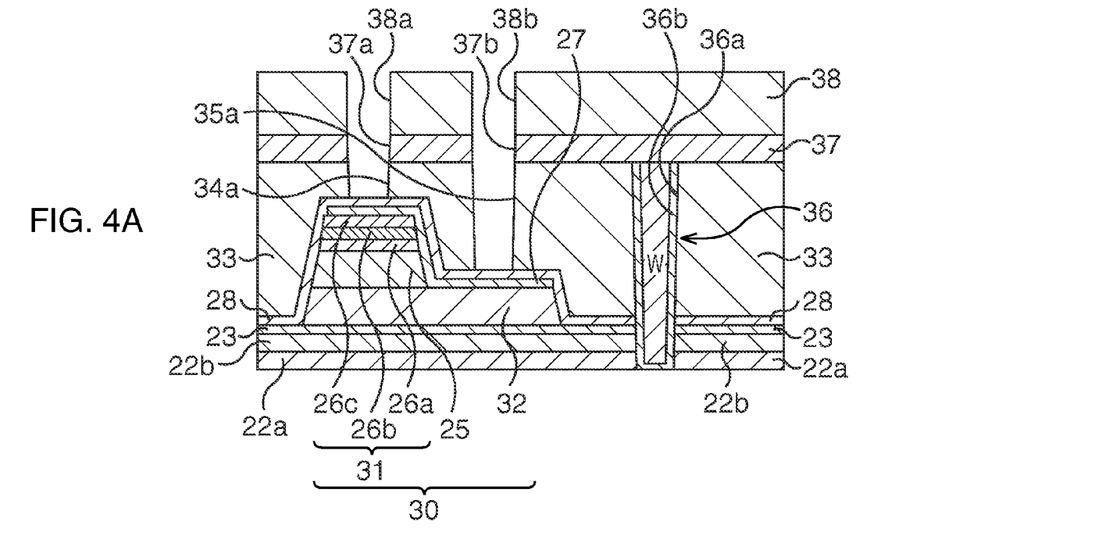
FIG. 4A to FIG. 4C are schematic sectional views showing the constitution of the planar-type FeRAM according to the present embodiment with the manufacturing method thereof step by step.

Then, as shown in FIG. 4A, after a hard mask 37 and a resist mask 38 are formed, first via holes 34a and 35a leading to the ferroelectric capacitor structure 30 are formed in the interlayer insulating film 33.

More specifically, first, a silicon nitride film is deposited with a thickness of about 100 nm on the interlayer insulating film 33 to form the hard mask 37. Then, a resist is applied onto the hard mask 37 and fabricated by lithography to form the resist mask 38 including openings 38a and 38b.

Subsequently, the hard mask 37 is dry etched using the resist mask 38 to form openings 37a and 37b in portions of the hard mask 37 aligned with the openings 38a and 38b.

Thereafter, using mainly the hard mask 37 and in the portions aligned with the tops of the upper electrode 31 and the lower electrode 32, the hydrogen diffusion preventing film 28 as etching stoppers, respectively, the interlayer insulating film 33 is dry etched. In this dry etching, a process performed on the interlayer insulating film 33 until part of the surface of the hydrogen diffusion preventing film 28 in the portion aligned with the top of upper electrode 31 is exposed and a process performed on the interlayer insulating film 33 until part of the surface of the hydrogen diffusion preventing film 28 in the portion aligned with the top of the lower electrode 32 is exposed are simultaneously performed, and thus the first via holes 34a and 35a, for example, with a diameter of about 0.5 μm are simultaneously formed in the respective portions. When the first via holes 34a and 35a are formed by this dry etching, the hydrogen diffusion preventing films 28 and 27 exist at the bottom of each of the via holes 34a and 35a, and, so to speak, the ferroelectric capacitor structure 30 is protected from plasma of the dry etching by these hydrogen diffusion preventing films 28 and 27. Therefore, the ferroelectric capacitor structure 30 is not damaged at the time of this dry etching.

Figure 4B:
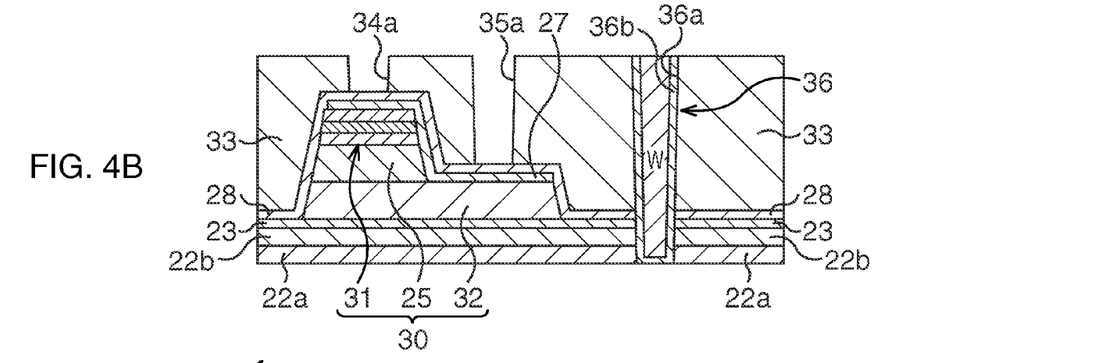

Then, as shown in FIG. 4B, the resist mask 38 and the hard mask 37 are removed.

To be more precise, first, the remaining resist mask 38 is removed by ashing or the like. Thereafter, the hard mask 37 is removed by overall anisotropic etching, that is, so-called etch back.

Figure 4C:
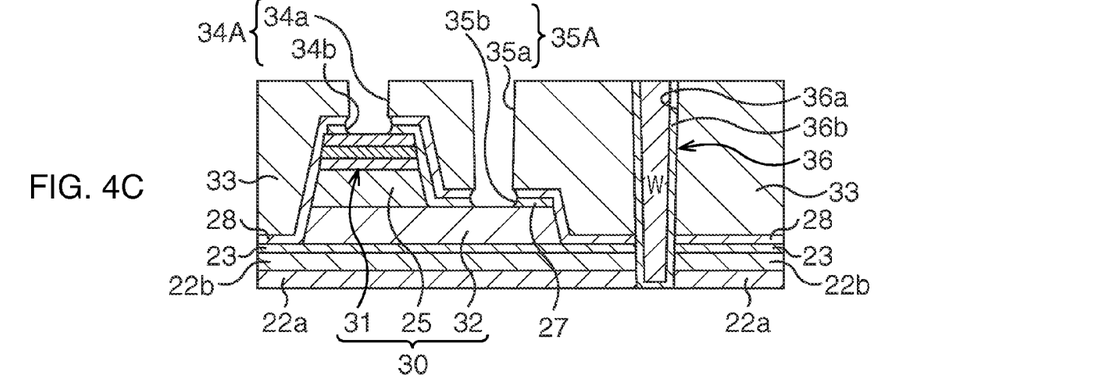

Subsequently, as shown in FIG. 4C, second via holes 34b and 35b to expose parts of the ferroelectric capacitor structure 30 are formed in the hydrogen diffusion preventing films 28 and 27 so as to be aligned with the first via holes 34a and 35a.

To put it in detail, the hydrogen diffusion preventing films 28 and 27 in portions exposed from the first via holes 34a and 35a are removed by wet etching, thereby forming the second via holes 34b and 35b aligned with the first via holes 34a and 35a. In this wet etching, a process performed on the hydrogen diffusion preventing films 28 and 27 until part of the surface of the upper electrode 31 is exposed and a process performed on the hydrogen diffusion preventing films 28 and 27 until part of the surface of the lower electrode 32 is exposed are simultaneously performed, and thus the second via holes 34b and 35b are simultaneously formed in the respective portions. At this time, the first via holes 34a and 35a are formed in an anisotropic shape which imitates the shape of the resist mask 38 and the hard mask 37, whereas the second via holes 34b and 35b are formed in an isotropic shape having a slightly lager diameter than the first via holes 34a and 35a (shape in which inner wall surfaces of the second via holes 34b and 35b are slightly hollowed out), and the first via hole 34a and the first via hole 35a communicate with the second via hole 34b and the second via hole 35b, respectively, to thereby form via holes 34A and 35A. Since the Pt film 26c made of noble metal which is extremely resistant to wet etching is provided at the uppermost layer of upper electrode 31, etching of the upper electrode 31 is suppressed when the second via hole 34b is formed by wet etching.

In this wet etching, the second via holes 34b and 35b are formed in a self-aligned manner by the first via holes 34a and 35a without causing such damage as in dry etching to the ferroelectric capacitor structure 30. Besides, simultaneously with the formation of the second via holes 34b and 35b in the hydrogen diffusion preventing films 28 and 27, unwanted residuals such as an etching residue and a scum which occur in the first via holes 34a and 35a and on the interlayer insulating film 33 due to dry etching at the time of the formation of the first via holes 34a and 35a are removed by an etching solution of the wet etching.

As the etching solution of this wet etching, a chemical containing ammonium fluoride, amide, organic acid, organic acid salts, and water (a first chemical: as an example, ACT NE89 (NE series) as a product name manufactured by Air Products and Chemicals, Inc., USA), or a chemical containing ammonium fluoride, glycol ether, amide, and water (a second chemical: as an example, EKC 2xx or 6xx (2xx or 6xx series) as a product name manufactured by EKC Technology K.K, USA (DuPont Electronic Technology group) is used. In the case of the first chemical, it is desirable to adjust the concentration of ammonium fluoride to not less than 1.0% and not more than 4.5% in order to obtain a sufficient effect of removing the residuals. In the case of the second chemical, it is desirable to adjust the concentration of ammonium fluoride to not less than 0.03% and not more than 4.5% also in order to obtain the sufficient effect of removing the residuals. Here, for example, the first chemical is used, and the concentration of ammonium fluoride is adjusted to 3.0%.

Figure 7A:
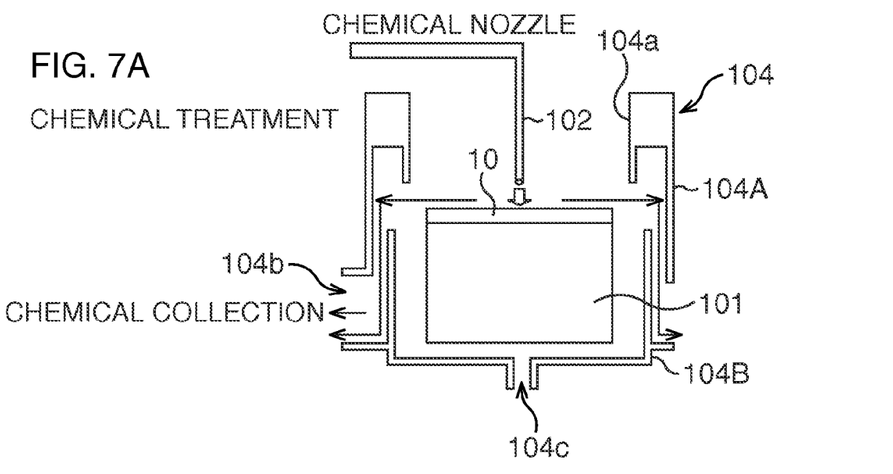
FIG. 7A to FIG. 7C are schematic views showing a schematic constitution of an etching apparatus used in the present embodiment.
Figure 7B:
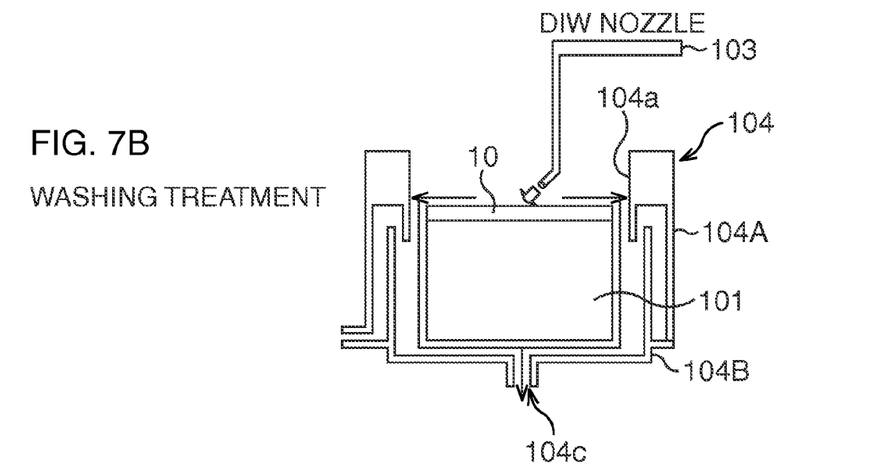
Figure 7C:
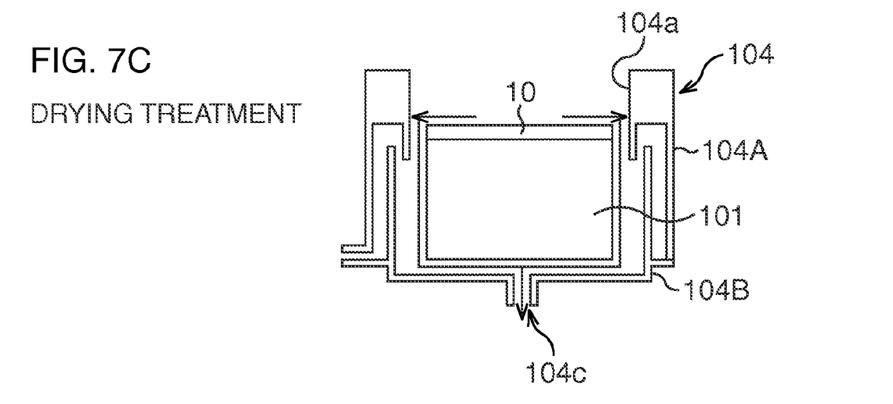

When this wet etching is performed, an etching apparatus such as shown in FIG. 7A to FIG. 7C is used.

This etching apparatus includes a substrate stage 101 which has a chucking function of holding a semiconductor substrate by suction and a rotating function (rotary motor) of rotating the semiconductor substrate, a chemical nozzle 102 which discharges and supplies the chemical to the surface of the semiconductor substrate, a DIW nozzle 103 which discharges and supplies deionized water (DIW) to the surface of the semiconductor substrate, and a housing section 104 of the substrate stage 101.

Here, the housing section 104 includes an opening 104a to place the chemical nozzle 102 or the DIW nozzle 103 near the surface of the semiconductor substrate, a chemical collection passage 104b, and a DIW drain passage 104c. An upper structure 104A of the housing section 104 is vertically movable with respect to a lower structure 104B, and the chemical collection passage 104b is opened and closed by adjusting the position of the upper structure 104A with respect to the lower structure 104B. While the chemical collection passage 104b is opened, only the collection passage 104b functions, and while the collection passage 104b is closed, only the DIW drain passage 104c functions.

In this wet etching, chemical treatment is first performed.

To describe it in detail, as shown in FIG. 7A, the silicon semiconductor substrate 10 on which first wirings 45 are pattern-formed is held by suction and fixed on the substrate stage 101, and the chemical nozzle 102 is placed from the opening 104a. While the silicon semiconductor substrate 10 is being rotated by the substrate stage 101, the chemical, here the first chemical, is discharged and supplied to the surface of the silicon semiconductor substrate 10 from the chemical nozzle 102. The first chemical used for the chemical treatment is collected through the collection passage 104b from the surface of the silicon semiconductor substrate 10.

Then, washing treatment is performed.

To put it in detail, as shown in FIG. 7B, the DIW nozzle 103 is placed from the opening 104a. While the silicon semiconductor substrate 10 is being rotated by the substrate stage 101, DIW is discharged and supplied to the surface of the silicon semiconductor substrate 10 from the DIW nozzle 103 to wash the surface. The DIW used for the washing treatment is drained to the outside through the drain passage 104c from the surface of the silicon semiconductor substrate 10.

Subsequently, drying treatment is performed.

To be more precise, as shown in FIG. 7C, by rotating the silicon semiconductor substrate 10 at a higher rotational frequency than at the time of washing by the substrate stage 101 to throw off the DIW existing on the surface of the silicon semiconductor substrate 10, the surface is dried. The DIW thrown off by the drying treatment is drained to the outside through the drain passage 104c.

An example of concrete conditions of the above-described chemical treatment, washing treatment, and drying treatment will be shown in the following Table 1.

TABLE 1

| Item | Rotational Frequency [rpm] | Treatment Time [sec] |
|---|---|---|
| 1) Chemical | 120 | Variable |
| 2) Washing | 300 | 60 |
| 3) Drying | 4000 | 20 |

As described above, by performing wet etching, as shown in FIG. 4C, the first via holes 34a and 35a communicate with the second via holes 34b and 35b, respectively, thereby forming the via holes 34A and 35A, and the unwanted residuals such as the etching residue and the scum which occur in the first via holes 34a and 35a and on the interlayer insulating film 33 are completely removed to a negligible extent in practical application.

Figure 5A:
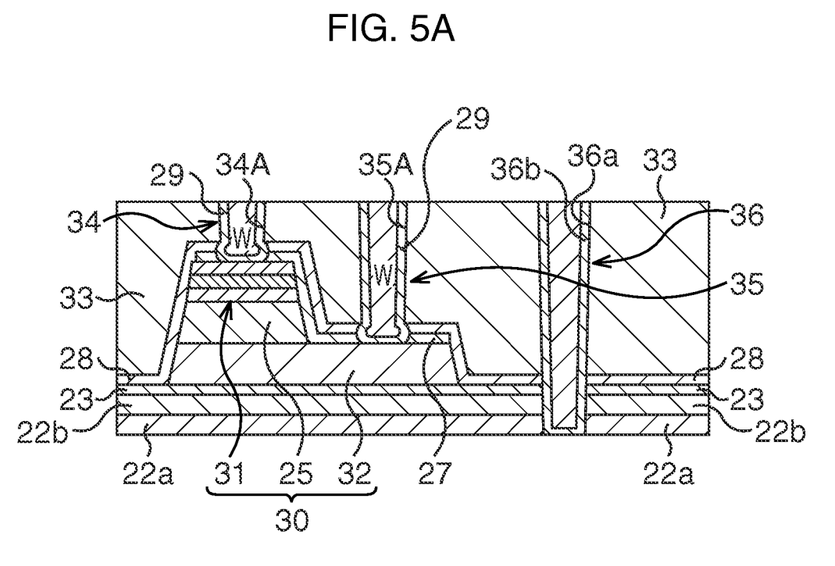
FIG. 5A and FIG. 5B are schematic sectional views showing the constitution of the planar-type FeRAM according to the present embodiment with the manufacturing method thereof step by step.

Then, as shown in FIG. 5A, plugs 34 and 35 connected to the ferroelectric capacitor structure 30 are formed.

To put it in detail, for example, a Ti film and a TiN film are sequentially deposited with a thickness of about 20 nm and a thickness of about 50 nm, respectively so as to cover inner wall surfaces of the via holes 34A and 35A by the sputtering method, thereby forming a base film (glue film) 29. Subsequently, for example, a W film is formed so as to fill the via holes 34A and 35A with the glue film 29 therebetween by the CVD method. Thereafter, as the interlayer insulating film 33 as a stopper, the W film and the glue film 29 are polished by CMP, thereby forming the plugs 34 and 35 constructed by filling the via holes 34A and 35A with W with the glue film 29 therebetween. After CMP, for example, $N_2O$ plasma annealing is performed.

Figure 5B:
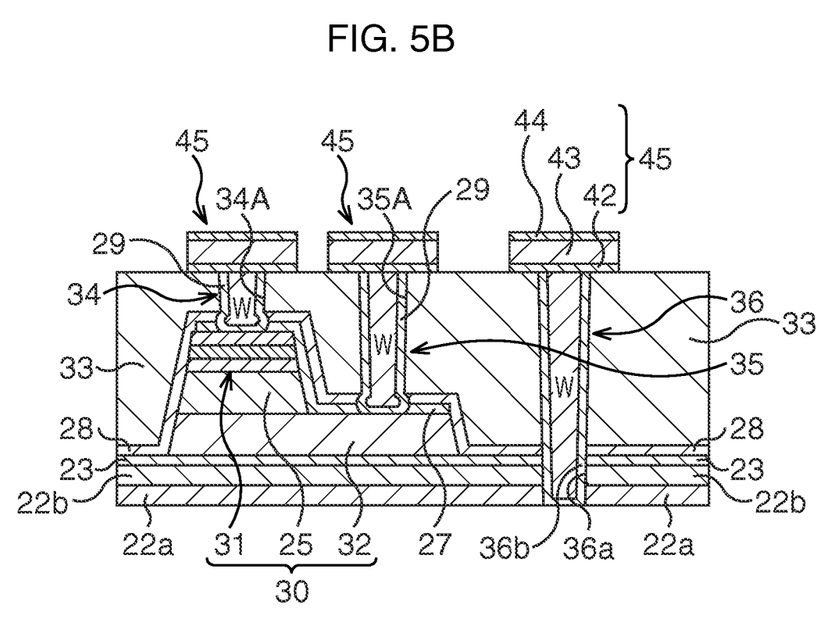

Then, as shown in FIG. 5B, the first wirings 45 connected to the plugs 34, 35, and 36, respectively, are formed.

To put it in detail, first, a barrier metal film 42, a wiring film 43, and a barrier metal film 44 are deposited over the entire surface of the interlayer insulating film 33. As the barrier metal film 42, for example, a TiN film is formed to have a thickness of about 150 nm by the sputtering method. As the wiring film 43, for example, an Al alloy film (here an Al—Cu film) is formed to have a thickness of about 350 nm. As the barrier metal film 44, for example, a TiN film is formed to have a thickness of about 150 nm by the sputtering method. Here, the structure of the wiring film 43 is the same as the structure of a logic section other than the FeRAM with the same rule, so that there is no problem in terms of wiring fabrication and reliability.

Subsequently, after, for example, a SiON film (not shown) as an antireflection film is formed, the antireflection film, the barrier metal film 44, the wiring film 43, and the barrier metal film 42 are fabricated into wiring shapes by lithography and dry etching subsequent thereto to pattern-form the first wirings 45 connected to the plugs 34, 35, and 36, respectively. Incidentally, it is also possible to, instead of forming the Al alloy film as the wiring film 43, form a Cu film (or a Cu alloy film) by a so-called damascene method or the like and form a Cu wiring as the first wiring 45.

Figure 6:
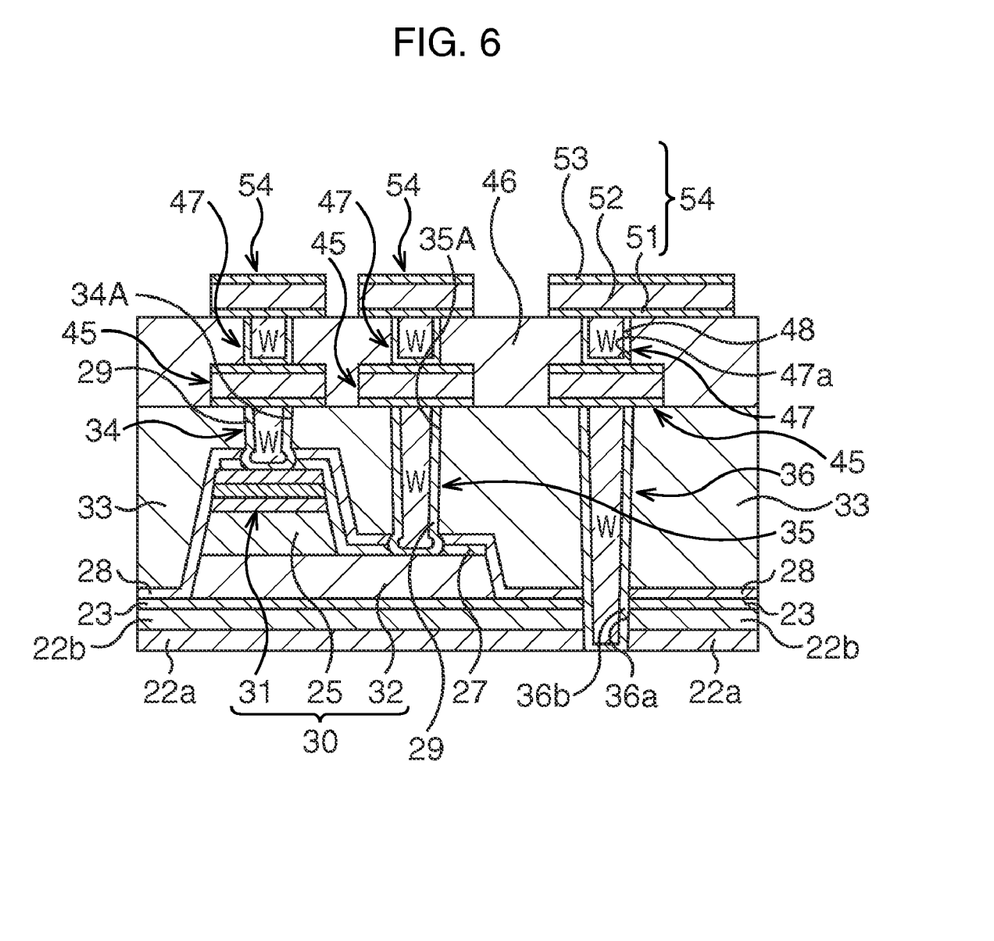
FIG. 6 is a schematic sectional view showing the constitution of the planar-type FeRAM according to the present embodiment with the manufacturing method thereof step by step.

Thereafter, as shown in FIG. 6, second wirings 54 connected to the first wirings 45 are formed.

To be more precise, first, an interlayer insulating film 46 is formed so as to cover the first wirings 45. The interlayer insulating film 46 is formed to have a thickness of about 750 nm by forming a silicon oxide film with a thickness of about 700 nm, then forming a plasma TEOS film such that a total thickness becomes about 1100 nm, and thereafter polishing the surface by CMP.

Then, plugs 47 connected to the first wirings 45 are formed.

Via holes 47a, for example, with a diameter of about 0.25 µm are formed by fabricating the interlayer insulating film 46 by lithography and dry etching subsequent thereto until part of the surface of each of the first wirings 45 is exposed. Subsequently, after a base film (glue film) 48 is formed so as to cover wall surfaces of the via holes 47a, a W film is formed so as to fill the via holes 47a each with the glue film 48 therebetween by the CVD method. As the interlayer insulating film 46 as a stopper, for example, the W film and the glue film 48 are polished, thereby forming the plugs 47 each constructed by filling the via hole 47a with W with the glue film 48 therebetween.

Thereafter, second wirings 54 connected to the plugs 47, respectively, are formed.

First, a barrier metal film 51, a wiring film 52, and a barrier metal film 53 are deposited over the entire surface by the sputtering method or the like. As the barrier metal film 51, for example, a TiN film is formed to have a thickness of about 150 nm by the sputtering method. As the wiring film 52, for example, an Al alloy film (here an Al—Cu film) is formed to have a thickness of about 350 nm. As the barrier metal film 53, for example, a TiN film is formed to have a thickness of about 150 nm by the sputtering method. Here, the structure of the wiring film 43 is the same as the structure of the logic section other than the FeRAM with the same rule, so that there is no problem in terms of wiring fabrication and reliability.

Then, after, for example, a SiON film (not shown) as an antireflection film is formed, the antireflection film, the barrier metal film 53, the wiring film 52, and the barrier metal film 51 are formed into wiring shapes by lithography and dry etching subsequent thereto, thereby pattern-forming the second wirings 45.

Thereafter, through various steps including the formation of an interlayer insulating film and a further upper-layer wiring, the planar-type FeRAM according to this embodiment is completed.

As described above, according to this embodiment, it is possible to realize the highly reliable FeRAM which makes it possible to form the via holes 34A and 35A for the ferroelectric capacitor structure 30 in the interlayer insulating film 33 and the hydrogen diffusion preventing films 28 and 27 and moreover remove unwanted residuals without unnecessarily increasing the number of steps and causing damage to the ferroelectric capacitor structure 30.

Incidentally, although the so-called planar-type FeRAM is shown as an example in this embodiment, the present invention is not limited to this example but applicable to a so-called stack-type FeRAM with a constitution in which continuity is obtained by forming conductive plugs under a lower electrode and on an upper electrode of a ferroelectric capacitor structure. In this case, when a via hole to expose part of the surface of the upper electrode is formed in an interlayer insulating film which covers the ferroelectric capacitor structure with a hydrogen diffusion preventing film therebetween, a first via hole is formed by dry etching the interlayer insulating film, and then a second via hole which communicates with the first via hole is formed by wet etching the hydrogen diffusion preventing film in the same manner as above.

According to the present invention, it is possible to realize a highly reliable semiconductor device which makes it possible to form an opening for a ferroelectric capacitor in an interlayer insulating film and a hydrogen diffusion preventing film and moreover remove unwanted residuals without unnecessarily increasing the number of steps and causing damage to the ferroelectric capacitor.

The present embodiment is to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device, comprising:
    forming a capacitor structure, which is constructed by sandwiching a capacitor film made of a ferroelectric between a lower electrode and an upper electrode, above a semiconductor substrate;
    forming a hydrogen diffusion preventing film so that the capacitor structure is covered therewith;
    forming an interlayer insulating film which covers the capacitor structure with the hydrogen diffusion preventing film therebetween; and
    forming an opening in the interlayer insulating film and the hydrogen diffusion preventing film so that at least part of the capacitor structure is exposed in order to perform wiring connection of the capacitor structure, wherein said process of forming the opening includes:
    a first process of forming a first opening in the interlayer insulating film by dry etching until a part of a surface of the hydrogen diffusion preventing film is exposed; and
    a second process of forming a second opening in a portion of the hydrogen diffusion preventing film aligned with the first opening by wet etching,
    the opening constructed by the first opening and the second opening communicating with each other is formed.

2. The manufacturing method of the semiconductor device according to claim 1, wherein the hydrogen diffusion preventing film is made of at least one kind of material selected from the group consisting of $Al_2O_3$ (alumina), Al nitrogen oxide, Ta oxide, and Ti oxide.

3. The manufacturing method of semiconductor device according to claim 1, wherein the capacitor structure is of a planar type in which continuity is obtained on the lower electrode and on the upper electrode, respectively.

4. The manufacturing method of the semiconductor device according to claim 3, wherein in forming the opening, the opening to expose part of a surface of the lower electrode and the opening to expose part of a surface of the upper electrode are formed in the same process.

5. The manufacturing method of the semiconductor device according to claim 1, wherein the upper electrode includes a noble metal film in its uppermost layer.

6. The manufacturing method of the semiconductor device according to claim 5, wherein the noble metal film is made of Pt (platinum) or Ir (iridium).

7. The manufacturing method of the semiconductor device according to claim 1, wherein the wet etching is performed using a chemical containing ammonium fluoride, amide, organic acid, organic acid salts, and water.

8. The manufacturing method of the semiconductor device according to claim 7, wherein in the chemical, the concentration of the ammonium fluoride is not less than 1.0% and not more than 4.5%.

9. The manufacturing method of the semiconductor device according to claim 1, wherein the wet etching is performed using a chemical containing ammonium fluoride, glycol ether, amide, and water.

10. The manufacturing method of the semiconductor device according to claim 9, wherein in the chemical, the concentration of the ammonium fluoride is not less than 0.03% and not more than 4.5%.

* * * * *